(12) United States Patent
Tada (10) Patent No.: US 11,239,218 B2
(45) Date of Patent: Feb. 1, 2022

(54) LIGHT EMITTING MODULE HAVING A RED LIGHT SOURCE, A GREEN LIGHT SOURCE AND A BLUE LIGHT SOURCE

(71) Applicant: NICHIA CORPORATION, Anan (JP)

(72) Inventor: Takaaki Tada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 204 days.

(21) Appl. No.: 16/582,259

(22) Filed: Sep. 25, 2019

(65) Prior Publication Data

US 2020/0098735 A1 Mar. 26, 2020

(30) Foreign Application Priority Data

Sep. 25, 2018 (JP) .............................. JP2018-178264

(51) Int. Cl.
*H01L 33/00* (2010.01)
*H01L 25/13* (2006.01)
*F21V 3/04* (2018.01)
*H01L 33/50* (2010.01)
*F21Y 115/10* (2016.01)
*F21Y 113/13* (2016.01)
(Continued)

(52) U.S. Cl.
CPC .............. *H01L 25/13* (2013.01); *F21V 3/049* (2013.01); *H01L 33/505* (2013.01); *F21V 7/28* (2018.02); *F21Y 2103/10* (2016.08); *F21Y 2113/13* (2016.08); *F21Y 2115/10* (2016.08); *H01L 33/32* (2013.01); *H01L 33/38* (2013.01); *H01L 33/40* (2013.01); *H01L 33/502* (2013.01); *H01L 33/60* (2013.01)

(58) Field of Classification Search
CPC ..... H01L 33/507; H01L 33/504; H01L 33/58; F21V 3/049
See application file for complete search history.

(56) References Cited

U.S. PATENT DOCUMENTS

2008/0211386 A1 9/2008 Choi et al.
2010/0207134 A1 8/2010 Tanaka et al.
(Continued)

FOREIGN PATENT DOCUMENTS

JP 2008-166782 A 7/2008
JP 2009224074 A 10/2009
(Continued)

*Primary Examiner* — Phuc T Dang
(74) *Attorney, Agent, or Firm* — Global IP Counselors, LLP (57) ABSTRACT

A light emitting module includes red, green and blue light sources, and a light diffusing member is arranged above the light sources. The red light source includes a first light emitting element configured to emit light in a range from ultraviolet to blue, a first phosphor layer containing a first phosphor configured to emit red light, and a first film configured to transmit red light and block light in the range from ultraviolet to blue. The green light source includes a second light emitting element configured to emit light in the range from ultraviolet to blue, a second phosphor layer containing a second phosphor configured to emit green light, and a second film configured to transmit green light and block light in the range from ultraviolet to blue. The blue light source includes a third light emitting element configured to emit light in the range from ultraviolet to blue.

9 Claims, 3 Drawing Sheets

(51) Int. Cl.
*F21V 7/28* (2018.01)
*H01L 33/32* (2010.01)
*H01L 33/38* (2010.01)
*H01L 33/40* (2010.01)
*H01L 33/60* (2010.01)
*F21Y 103/10* (2016.01)

(56) References Cited

U.S. PATENT DOCUMENTS

| | | |
|---|---|---|
| 2013/0264937 A1 | 10/2013 | Sakuta et al. |
| 2014/0191258 A1 | 7/2014 | Akimoto et al. |
| 2014/0211308 A1* | 7/2014 | Shin ................ G02B 30/27 359/463 |
| 2017/0077172 A1 | 3/2017 | Kiba |
| 2017/0272599 A1* | 9/2017 | Asano ................ H04N 1/0318 |
| 2018/0047880 A1* | 2/2018 | Lim ................ H01L 33/56 |
| 2018/0182940 A1* | 6/2018 | Yamamoto ............ H01L 33/504 |

FOREIGN PATENT DOCUMENTS

| | | |
|---|---|---|
| JP | 2012104814 A | 5/2012 |
| JP | 2013065726 A | 4/2013 |
| JP | 2013257985 A | 12/2013 |
| JP | 2015-076527 A | 4/2015 |
| JP | 2017054749 A | 3/2017 |
| JP | 2018147559 A | 9/2018 |
| WO | 2013154133 A1 | 10/2013 |

* cited by examiner

LIGHT EMITTING MODULE HAVING A RED LIGHT SOURCE, A GREEN LIGHT SOURCE AND A BLUE LIGHT SOURCE

CROSS REFERENCE TO RELATED APPLICATIONS

This application claims priority to Japanese Patent Application No. 2018-178264, filed on Sep. 25, 2018. The entire disclosure of Japanese Patent Application No. 2018-178264 is hereby incorporated herein by reference.

TECHNICAL FIELD

The present invention relates to a light emitting module.

BACKGROUND ART

Light emitting modules comprising red, green, and blue light emitting devices are known. (For example, see Japanese Laid-Open Patent Application Publication No. 2008-166782 and Japanese Laid-Open Patent Application Publication No. 2015-076527).

SUMMARY

There is demand for a light emitting module for which color tone can be controlled easily.

An embodiment of the present invention includes the following configuration.

A light emitting module includes a red light source, a green light source, and a blue light source. The red light source includes a first light emitting element configured to emit light in a range from ultraviolet to blue, a first phosphor layer arranged on the first light emitting element, and containing a first phosphor configured to emit red light, and a first film arranged on the first phosphor layer, and configured to transmit red light and block light the range from ultraviolet to blue. The green light source includes a second light emitting element configured to emit light in the range from ultraviolet to blue, a second phosphor layer arranged on the second light emitting element, and containing a second phosphor configured to emit green light, and a second film arranged on the second phosphor layer, and configured to transmit green light and block light in the range from ultraviolet to blue. The blue light source includes a third light emitting element configured to emit light in the range from ultraviolet to blue. The light diffusing member is arranged above the red light source, the green light source, and the blue light source.

From the above, it is possible to have a light emitting module for which control of color tone is easy.

DETAILED DESCRIPTION OF EMBODIMENTS

Following, modes for carrying out the present invention are explained in detail based on drawings. With the explanation hereafter, terms indicating a specific direction or position are used as necessary ("up," "down," and other terms including those terms, for example). Those terms are for making the invention easier to understand when referencing the drawings, and the technical scope of the present invention is not limited by the meaning of those terms. Parts with the same code number expressed in a plurality of drawings indicate the same parts or members.

A light emitting module 10 of an embodiment comprises a light source 100, and a light diffusing member 200. The light source 100 includes three types of light source of different light emission colors. In specific terms, the light source 100 includes at least one red light source 110, at least one green light source 120, and at least one blue light source 130. The light diffusing member 200 is arranged above the light emitting surfaces of the three color light sources 100. Light from the plurality of light sources 100 is diffused by the light diffusing member 200, and is radiated to outside as mixed color light.

The red light source 110 comprises a first light emitting element 111 that emits light in a color range from ultraviolet to blue. The red light source 110 comprises a first phosphor layer 112 disposed on the first light emitting element 111. The first phosphor layer 112 emits red light that is excited by the light in the color range from ultraviolet to blue. Comprised on the first phosphor layer 112 is a first film 113 that transmits red light and reflects the light in the color range from ultraviolet to blue.

Similarly, the green light source 120 comprises a second light emitting element 121 that emits light in a color range from ultraviolet to blue. The green light source 120 comprises a second phosphor layer 122 on the light emitting element 121 that emits green light that is excited by the light in the color range from ultraviolet to blue. On the second phosphor layer 122, a second film 123 is arranged that transmits green light and reflects the light in the color range from ultraviolet to blue.

By using a configuration that comprises the first film 113 or the second film 123 as described above, red light is radiated from the red light source 110, and green light is radiated from the green light source 120. In other words, the first film 113 and the second film 123 comprise a function as a filter for which only red light or green light are transmittable.

A portion of the light radiated from each light source 100 is diffused or reflected by the light diffusing member 200, and is returned to the light source 100 side. That is, the red light from the red light source 110, the green light from the green light source 120 and the blue light from the blue light source 130 are irradiated as return light also to light sources other than the light source which was the respective radiation source. Specifically, the blue light radiated from the blue light source 130 is irradiated also on the red light source 110 and the green light source 120.

The first phosphor layer 112 of the red light source 110 and the second phosphor layer 122 of the green light source 120 are excited by blue light that is radiated from the blue light source 130 and that is the return light diffused by the light diffusing member 200, and are capable of radiating red light or green light. However, the first film 113 is arranged on the first phosphor layer 112, and the second film 123 is arranged on the second phosphor layer 122. This first film 113 and second film 123 block blue light radiated from the blue light source 130, For that reason, the first phosphor layer 112 and the second phosphor layer 122 do not have blue light irradiated from the blue light source 130. For that reason, the first phosphor layer 112 is excited only by light from the first light emitting element 111 band emits red light, and the second phosphor layer 122 is excited only by light from the second light emitting element 121 and emits green light. In this way, the first film 113 and the second film 123 comprise a function as a light shielding member that prevents irradiation of light from the blue light source 130 to the first phosphor layer 112 and the second phosphor layer 122.

By using the light emitting module 10 with this kind of configuration, it is possible for the red light source 110 and the green light source 120 to emit light of a desired wavelength without being affected by light from the blue light source 130. For that reason, control of the color tone of the light emitting module 10 is easier.

The blue light source 130 does not comprise a phosphor layer that is excited by red light or green light and converts to light of a different wavelength. For that reason, it is not necessary for the blue light source 130 to include a film that comprises a light shielding function like that of the red light source 110 or the green light source 120.

Also, the red light source 110 and the green light source 120 respectively do not comprise a red light emitting semiconductor light emitting element (red element) or a green light emitting semiconductor light emitting element (green element), but comprise a semiconductor light emitting element that emits light from the color range from ultraviolet to blue. As a result, compared to when using a red element or a green element, it is possible to improve color purity.

The light emitting module 10, in addition to the light source 100 and the light diffusing member 200 described above, can also comprise a wiring board 300 on which the light source 100 can be mounted. Also, as a member for holding the light diffusing member 200, for example, it is possible to comprise a ring shaped side wall member 400 arranged so as to surround the light source 100, or a holding member 500 arranged outside of the ring shaped side wall member 400. As a result, it is possible to arrange the light diffusing member 200 above the light source 100, separated from the light source 100.

Each embodiment is explained in detail hereafter.
(Light Source)

Figure 1A:
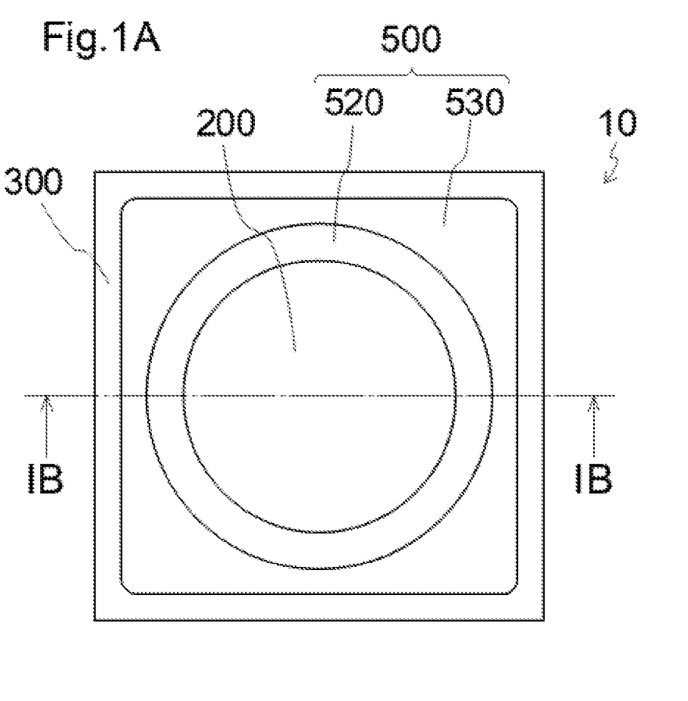
FIG. 1A is a schematic top view showing an example of a light emitting module.
Figure 1B:
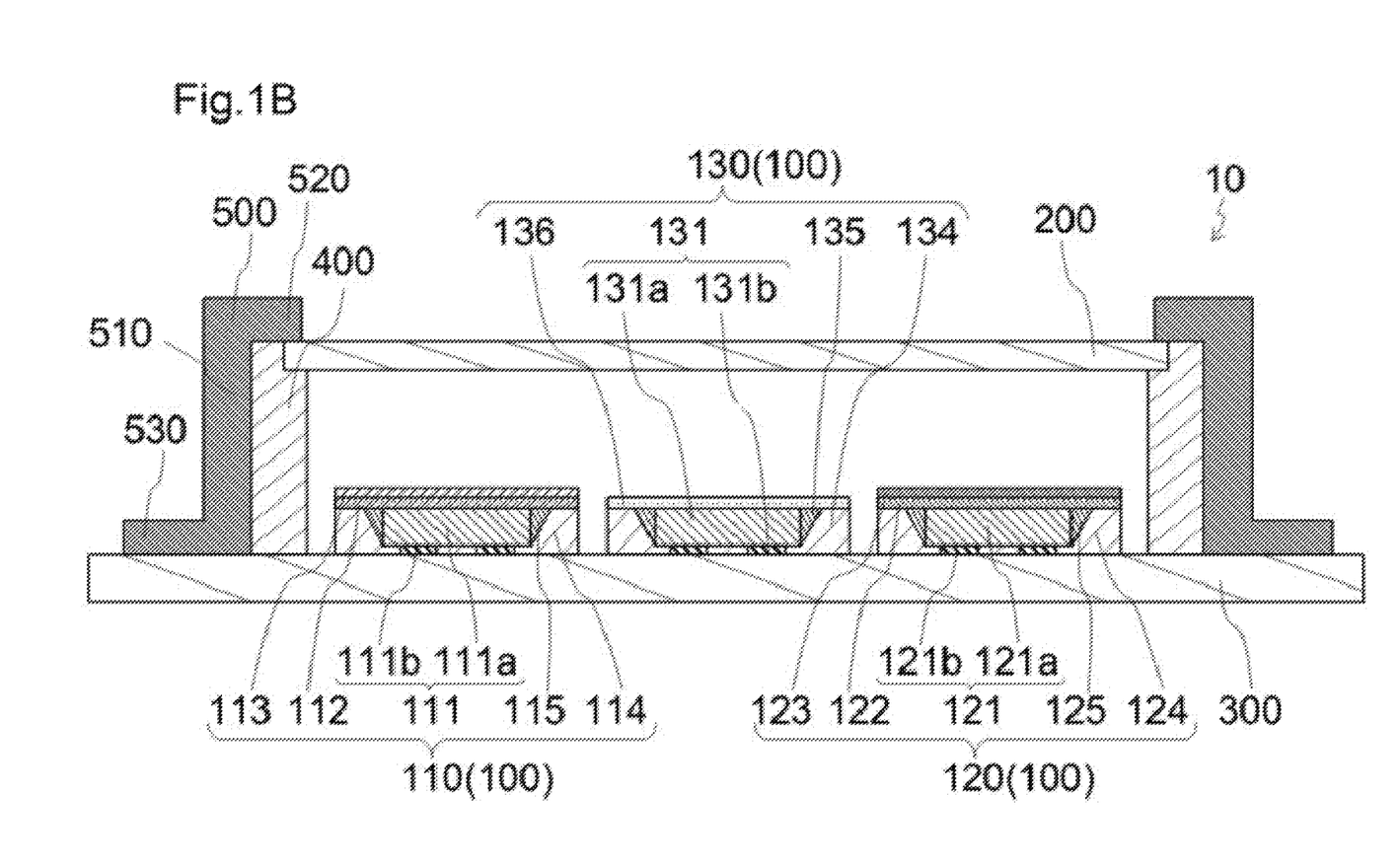
FIG. 1B is a schematic cross section view of line IB-IB of FIG. 1A.

The light source 100 is configured by three color light sources of the red light source 110, the green light source 120, and the blue light source 130. There is at least one or more of each light source 100. The quantity of each light source 100 can be changed as appropriate according to the purpose or application. With the example shown in FIG. 1B, light sources 100 of three colors are arranged in order from the left to right as the red light source 110, the blue light source 130, and the green light source 120. However, the arrangement of the light sources 100 is not limited to this. Also, as shown in FIG. 1B, the interval between each light source 100 can be arranged at equal intervals. However, the invention is not limited to that, and it is also possible to arrange them at differing intervals.

Each light source 100 has the respective top surface as the light emitting surface. Said another way, the optical axis of each light source 100 is arranged so as to intersect the light diffusing member 200 arranged above. With the example shown in FIG. 1B, the optical axes of the light sources 100 are arranged to be respectively parallel.

The height of each light source 100 can be approximately the same height. Also, the size of each light source 100 can be approximately the same size seen in the plan view.
(Red Light Source)

The red light source 110 comprises the first light emitting element 111, the first phosphor layer 112 arranged on top of the first light emitting element 111, and the first film 113 arranged on top of the first phosphor layer 112. The first light emitting element emits light in the color range from ultraviolet to blue. In specific terms, the dominant wavelength of light emitted from the first light emitting element 111 is 440 nm to 450 nm. The first light emitting element 111 comprises a first laminated structure 111a and a pair of first electrodes 111b. To give a more detailed description, comprised on the same surface side of the first laminated structure 111a are two first electrodes 111b which make a positive/negative pair. The light emitting element for which the dominant wavelength of emitted light is in an ultraviolet range is also called an ultraviolet light emitting element, and the light emitting element for which the dominant wavelength of emitted light is in a blue range is also called a blue light emitting element.

The first laminated structure 111a includes a semiconductor layer that includes a light emitting layer. Furthermore, it is also possible to comprise a translucent substrate of sapphire, etc. As an example of a semiconductor laminate, it is possible to include three semiconductor layers of a first electrically conductive type semiconductor layer (an n type semiconductor layer, for example), a light emitting layer (an active layer), and a second electrically conductive type semiconductor layer (a p type semiconductor layer, for example). It is possible to obtain a semiconductor layer capable of emitting light in a color range from blue to ultraviolet, by using, for example, a semiconductor material such as a group III-V compound semiconductor, etc. Specifically, it is possible to use a nitride, type semiconductor material such as $In_xAl_yGa_{1-x-y}N$ ($0 \leq X$, $0 \leq Y$, $X+Y \leq 1$), etc. The thickness of the first laminated structure 111a can be 3 μm to 500 μm, for example.

The first electrodes 111b can be formed at any thickness using materials and configurations known in the applicable field. For example, the thickness of the first electrodes 111b is preferably 1 μm to 300 μm. Also, as the first electrodes 111b, it is possible to use a good electrical conductor, with a metal such is Cu, etc., being optimal. For the top surface view shape of the first electrodes 111b, it is possible to select various shapes according to the purpose or application, etc.

The red light source 110 comprises the first phosphor layer 112 on the first light emitting element 111. The first phosphor layer 112 contains a first phosphor that absorbs light from the first light emitting element 111 and that emits red light. As the first phosphor that emits red light, examples include nitride type phosphors such as CASN type phosphor, SCASN type phosphor, etc., a KSF type phosphor ($K_2SiF_6$:Mn) etc.

The first phosphor layer 112 can also comprise a translucent resin material, glass, etc., as the base material. As the specific material of the base material, it is possible to use a thermosetting resin such as silicone resin, silicone modified resin, epoxy resin, phenol resin, etc. Also, it is possible to use a thermoplastic resin such as polycarbonate resin, acrylic resin, methylpentene resin, polynorbornene resin, etc. In particular, it is optimal to use a silicone resin that is excellent in terms of light resistance and heat resistance. It is preferable that the base material have transmittance of 70% or greater with respect to light from the first light emitting element, more preferably 80% or greater, and even more preferably 90% or greater.

The red light source 110 comprises the first film 113 on the first phosphor layer 112. The first film 113 transmits red light, and blocks light in the color range from ultraviolet to blue. That is, the light radiated from the red light source 110 is configured only by red light from the first phosphor layer 112. The light radiated from the blue light source 130 arranged near the red light source 110 is diffused by the light diffusing member 200, and when a portion of that is irradiated on the red light source 110, it is possible to shield that blue light from entering the first phosphor layer 112 using the first film 113. In this way, it is possible to suppress excitation of the first phosphor layer 112 by light from other than the red light source 110, and possible to suppress unintended red light emission.

As the first film 113, an example is a dielectric multilayer film. When using the dielectric multilayer film, for example, examples include items that use titanium oxide, silicon oxide, zirconium oxide, potassium titanate, aluminum oxide, aluminum nitride, etc. The total thickness of the first film 113 can be 0.5 to 3 µm, for example. Also, it is preferable that the first film 113 cover the entire surface of the top surface of the first phosphor layer 112. The first film 113 can be a dielectric multilayer film that transmits red light, with alternate layering of a low refractive index material (silicon oxide, for example) and a high refractive index material (niobium oxide, for example) in order to block light in the color range from ultraviolet to blue. This kind of dielectric multilayer film can have a total of 10 to 40 layers, for example, and preferably is layered with 20 to 35 layers.

As shown by example in FIG. 1B, the red light source 110 can comprise a first light guide member 115, and a first coating member 114. The first light guide member 115 is a translucent member. The first light guide member 115 can function as an adhesive agent for bonding the first light emitting element 111 and the first phosphor layer 112.

The first light guide member 115 preferably covers 50% or more of the side surface of the first light emitting element 111. The outside surface of the first light guide member 115 is preferably covered by the first coating member 114. As described later, there is a light reflective member as the first coating member 114. Also, it is preferable that the side surface of the first light guide member 115 be an inclined plane that is inclined upward. By using this kind of configuration, the light radiated from the side surface of the first light emitting element 111 can be reflected by the inclined plane and made incident efficiently on the first phosphor layer 112 that is positioned upward (the light emitting surface direction of the first light emitting element 111).

As the first light guide member 115, it is possible to use glass or a resin material, for example. As the resin material, it is possible to use a thermosetting resin such as silicone resin, silicone modified resin, epoxy resin, phenol resin, etc., for example. It is also possible to use a thermoplastic resin such as polycarbonate resin, acrylic resin, methylpentene resin, polynorbornene resin, etc. In particular, silicone resin which is excellent in terms of light resistance and heat resistance, is optimal. With the first light guide member 115, the transmittance with respect to light from the first light emitting element 111 is preferably 70% or greater, more preferably 80% or greater, and even more preferably 90% or greater. The first light guide member 115 may include a diffusion material, or a phosphor that converts light from the first light emitting element 111, etc., or it may also not include these. The first light guide member 115 preferably does not include the diffusion material or the phosphor, and consists only of the resin material described above or glass. By doing this, scattering of light inside the first light guide member 115 is suppressed, and it is possible to efficiently do light guiding of light to the first phosphor layer 112.

The first coating member 114 directly or indirectly covers the side surface of the first light emitting element 111. With the light emitting module 10 shown by example in FIG. 1B, the first coating member 114 indirectly covers the side surface of the first light emitting element 111 with the first light guide member 115 interposed.

The first coating member 114 is covered so that at least a portion of the respective pair of first electrodes 111b of the first light emitting element 111 is exposed. In more detail, the first coating member 114 covers the side surface of the first electrode 111b, and does not cover the bottom surface of the first electrode 111b. The bottom surface of the first coating member 114 configures a portion of the bottom surface of the red light source 110. With the red light source 110 shown in FIG. 1B, the bottom surface of the first coating member 114 and the bottom surface of the first electrode 111b are positioned on the same surface.

The first coating member 114 is a member that can reflect light from the first light emitting element 111, and it is possible to use a resin material that contains a light reflective substance, for example. With the first coating member 114, it is preferable that the reflection crate with respect to light from the first light emitting element 111 be 70% or greater, more preferably 80% or greater, and even more preferably 90% or greater.

As the first coating member 114, for example, it is preferable to use as the base material a resin material with a main component of a thermosetting resin such as silicone resin, silicone modified resin, epoxy resin, phenol resin, etc. As the light reflective substance contained in the resin material, it is possible to use a white substance, for example. In specific terms, for example, titanium oxide, silicon oxide, zirconium oxide, potassium titanate, aluminum oxide, aluminum nitride, boron nitride, mullite, etc., are suitable. For the light reflecting substance, it is possible to use a granular form, fibrous form, or thin sheet form.

The red light source 110 is not limited to the kind of structure described above. Specifically, as long as the first light emitting element 111, the first phosphor layer 112, and the first film 113 are comprised, it is also possible to comprise another structure. For example, it is possible to use a structure such as with the first light emitting element 111 mounted in a housing comprising a recess, to arrange the first phosphor layer 112 so as to cover that first light emitting element 111, and furthermore, comprising the first film 113 on the first phosphor layer 112.

(Green Light Source)

The green light source 120 comprises the second light emitting element 121, the second phosphor layer 122 arranged on the second light emitting element 121, and the second film 123 arranged on the second phosphor layer 122. The second light emitting element 121 (a second laminated structure 121a and a second electrode 121b) can radiate light in a color range from ultraviolet to blue similarly to the first light emitting element 111, and because it is possible to apply the same configuration as that of the first light emitting element 111, a detailed description is omitted. The second light emitting element 121 can use a light emitting element of the same wavelength as that of the first light emitting element 111. For example, it is possible for the first light emitting element 111 to be a blue light emitting element, and for the second light emitting element to be a blue light emitting element. Alternatively, it is possible for the first light emitting element 111 to be a blue light emitting element, and for the second light emitting element 121 to be an ultraviolet light emitting element. Also, it is possible for the first light emitting element 111 to be an ultraviolet light emitting element, and for the second light emitting element 121 to be a blue light emitting element.

The green light source 120 comprises the second phosphor layer 122 on the second light emitting element 121. The second phosphor layer 122 contains a phosphor that absorbs light from the second light emitting element 121 and emits green light. As the second phosphor that emits green light, examples include cerium activated yttrium-aluminum-garnet type phosphor (YAG: Ce), cerium activated lutetium aluminum garnet type phosphor (LAG: Ce), nitrogen-containing calcium aluminosilicate activated with europium and/or chromium type phosphor ($CaO—Al_2O_3—SiO_2$), silicate type phosphor activated by europium $(Sr, Ba)_2SiO_4$), β sialon phosphor, etc.

With the second phosphor layer 122, the first phosphor contained in the first phosphor layer 112 can be replaced with the second phosphor, so it is possible to apply the same kind of configuration as that of the first phosphor layer 112 for the configuration other than the second phosphor described above, so a detailed description is omitted. The first phosphor layer 112 and the second phosphor layer 122 thickness, phosphor concentration, etc., are selected as appropriate according to the objective light emission color, etc.

The green light source 120 comprises the second film 123 on the second phosphor layer 122. The second film 123 transmits green light, and blocks light in the color range from ultraviolet to blue. That is, the light radiated from the green light source 120 is configured only by light from the second phosphor layer 122. Furthermore, the light radiated from the blue light source 130 arranged near the green light source 120 is diffused by the light diffusing member 200, and when a portion of that is irradiated on the green light source 120, it is possible to shield the blue light from entering the second phosphor layer 122 using the second film 123. By suppressing excitation of the second phosphor layer 122 by light from other than the green light source 120 in this way, it is possible to suppress unintended green light emission.

As the second film 123, an example is the dielectric multi layer film. The material, film thickness, etc., that can be used are the same as those for the first film 113, so a detailed description is omitted. The second film 123 is capable of transmitting green light, and block light in the color range from ultraviolet to blue, so it is possible to use a dielectric multilayer film for which a low refractive index material (silicon oxide, for example) and a high refractive index material (niobium oxide, for example) are alternately layered. This kind of dielectric multi layer film can have a total of 20 to 40 layers, and can be preferably an item with 25 to 35 layers layered.

As shown in FIG. 1B, the green light source 120 can have the same structure as that of the red light source 110. Specifically, it is possible to comprise a second light guide member 125 that is the same as the first light guide member 115 of the red light source 110. It is also possible to comprise a second coating member 124 that is the same as the first coating member 114 of the red light source 110. A detailed description of the second light guide member 125 and the second coating member 124 is omitted because it is possible to apply the same kind of configuration as that of the first light guide member 115 and the first coating member 114. It is also possible to have the green light source 120 be of a structure other than that shown in FIG. 1B, the same as with the red light source 110.

(Blue Light Source)

The blue light source 130 comprises a third light emitting element 131. For the third light emitting element 131 (a third laminated structure 131a and a third electrode 131b), the same structure as that of the first light emitting element 111 can be applied, so a detailed description is omitted.

As the third light emitting element 131, when using a light emitting element capable of doing light emission of blue light (blue light emitting element), it is also acceptable to not comprise a phosphor. Specifically, the light radiated from the blue light source 130 can be the same as the light radiated from the third light emitting element 131. Instead of the phosphor layer, it is possible to comprise a translucent layer 136. For the translucent layer 136, it is possible to use the same kind of member as that of the base material of the first phosphor layer 112.

Figure 1C:
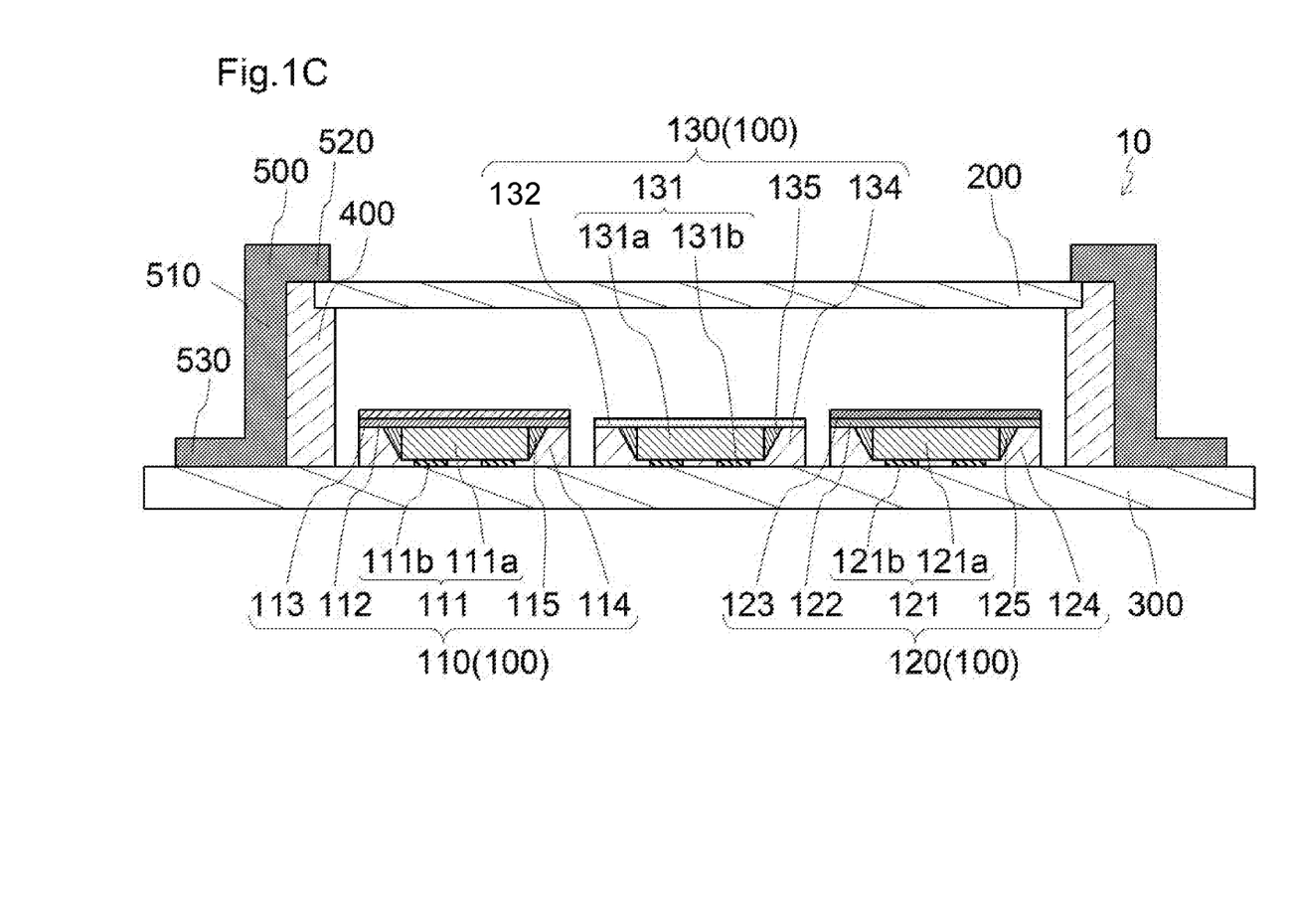
FIG. 1C is a schematic cross section view of another example of the light emitting module.

When using a light emitting element for which the third light emitting element 131 is capable of emitting ultraviolet light (ultraviolet light emitting element), it is necessary to have a third phosphor layer that includes a third phosphor that absorbs at least a portion of that ultraviolet light and is capable of emitting blue light. More specifically, when the third light emitting element 131 is an ultraviolet light emitting element, the translucent layer 136 shown to FIG. 1B is preferably replaced with the third phosphor layer 132 (which includes the third phosphor) as shown in FIG. 1C. Also, when the third light emitting element 131 is a blue light emitting element, it is also possible to comprise a third phosphor layer that includes a third phosphor capable of radiating blue light of a longer wavelength than the third light emitting element 131.

For the third light emitting element 131, it is possible to use a light emitting element or the same wavelength as the first light emitting element 111 and the second light emitting element 121. For example, it is possible to use a blue light emitting element for all of the first light emitting element 111, the second light emitting element 121, and the third light emitting element. Alternatively, it is possible to use an ultraviolet light emitting element for all of the first light emitting element 111, the second light emitting element 121, and the third light emitting element. Alternatively, it is also possible to use blue light emitting elements for two out of the three, and to use one ultraviolet light emitting element. Furthermore, it is possible to use a blue light emitting element for one out of the three, and to use an ultraviolet light emitting element for two.

When the blue light source 130 includes a third phosphor layer, the same as with the red light source 110 and the green light source 120, the third phosphor layer is arranged on the light emitting surface of the third light emitting element 131. As the third phosphor included in the third phosphor layer, examples include zinc sulfide cadmium, barium aluminum sulfide, etc.

The same as with the second phosphor layer 122 as described above, the third phosphor layer can have the same structure as the first phosphor layer 112 by replacing the first phosphor with the third phosphor, so it is possible to apply the same configuration as that of the first phosphor layer 112 described above for the configuration for the third phosphor layer (except for using the third phosphor instead of the first phosphor), so a detailed description is omitted.

As shown in FIG. 1B, the blue light source 130 can use the same structure as a structure for which the first film 113 or the second film 123 is excluded from the red light source 110 or the green light source 120. Specifically, it is possible to comprise a third light guide member 135 that is the same as the first light guide member 115 of the red light source 110. It is also possible to comprise a third coating member 134 that is the same as the first coating member 114 of the red light source 110. A detailed description of the third light guide member 135 and the third coating member 134 is omitted because it is possible to use the same configuration as that of the first light guide member 115 and the first coating member 114. Also, the same as with the red light source 110, it is also possible to use the blue light source 130 other than the structure shown in FIG. 1B.

(Light Diffusing Member)

The light diffusing member 200 is arranged above the light source 100 that includes the red light source 110, the green light source 120, and the blue light source 130. There is an air layer between the light emitting surface of each light source 100 and the light diffusing member 200. Said another way, the light emitting surface of each light source 100 and the light diffusing member 200 are arranged separated.

The light diffusing member 200 is preferably of a size arranged directly above all the light emitting surfaces of each light source 100. However, it is also acceptable to be of a size that does not cover above a portion of the light emitting surface.

The plan view shape of the light diffusing member 200 can be a square shape, a circular shape, a polygonal shape, or a shape that is a combination of these, or a shape for which a portion is missing, etc. Also, the light diffusing member 200 can be a flat plate shape, or can have a convex shape or a concave shape on a part of the top surface or the bottom surface or on both.

When the light diffusing member 200 is a plate shape, it is possible to mount on top of the side wall member 400 like that shown in FIG. 1B, for example. By doing this, it is possible to arrange the light diffusing member 200 above the light emitting surface of each light source 100 with an air layer interposed. It is also possible to have a light diffusing member of a shape comprising a leg part correlating to this kind of side wall member 400.

For the light diffusing member 200, for example, it is possible to use an item for which a light diffusing substance is contained in the translucent material of glass, resin, etc. Alternatively, it is possible to use an item for which a light diffusing substance is applied to the surface of the translucent member such as glass, resin, etc. As the light diffusing substance, examples include $TiO_2$, $SiO_2$, $ZrO_2$, $PbCO_3$, PbO, $Al_2O_3$, ZnO, $Sb_2O_3$, etc.

(Other Members)

The light emitting module 10, as shown in FIG. 1B, can comprise the wiring board 300, the side wall member 400, the holding member 500, etc.

The wiring board 300 comprises wiring for supporting each light source 100, as well as feeding power to each light source 100. The wiring board 300 is acceptable provided it is of a size for which it is possible to support the light diffusing member 200, and the plan view shape can be various shapes such as a square shape, a circular shape, a polygonal shape, etc. Furthermore, the wiring board 300 can have an electronic part such as a connector, etc., mounted.

The side wall member 400 is a member that supports the light diffusing member 200. As shown in FIG. 1A, the side wall member 400 preferably is a ring shape that surrounds the plurality of light sources 100 in the plan view. It is possible to have one light diffusing member 200 supported by one ring shaped side wall member 400, or alternatively, to have a plurality of the side wall members 400 arranged to form a ring shape, and to support one light diffusing member 200 with those.

The side wall member 400 preferably is a light reflecting member that can reflect light from each light source 100. For example, it is possible to use a member for which a light reflective substance such as $TiO_2$, $SiO_2$, $ZrO_2$, $PbCO_3$, PbO, $Al_2O_3$, ZnO, and $Sb_2O_3$, etc., is contained in a material of resin, glass, etc. Alternatively, it is also possible to arrange the light reflective substance described above by application or pasting, etc., on the inner wall of the translucent or light shielding side wall member 400.

When mounting the light diffusing member 200 on the side wall member 400, it is possible to fix this using an adhesive gent, etc. Alternatively, without using an adhesive agent, as shown in FIG. 1B, it is also possible to fix by sandwiching the light diffusing member 200 using the side wall member 400 and the holding member 500. The holding member 500 can be arranged at the outside of the side wall member 400, and the height is higher than the side wall member 400. The holding member 500, the same as with the side wall member 400, can be a ring shape in the plan view.

As shown in FIG. 1B, the holding member 500 can comprise a base 510, and an extension part 520 that is arranged on the top edge of the base 510, and that extends from the base 510 to the inside. With this extension part 520, the outer circumference of the light diffusing member 200 can be pressed from the top side. Also, the holding, member 500, as shown in FIG. 1B, can comprise a flange part 530 at the bottom end of the base 510, extending from the base 510 to the outside. The flange part 530 faces opposite the top surface of the wiring board 300. Screw holes, etc. for example can be provided on the flange part 530. By doing this, it is possible to fix the holding member 500 to the wiring board 300 using screws.

For the holding member 500, it is possible to use a material such as metal, resin, glass, or a composite material of these.

What is claimed is:

1. A light emitting module comprising:
   a red light source including
      a first light emitting element configured to emit light in a range from ultraviolet to blue,
      a first phosphor layer arranged on the first light emitting element, and containing a first phosphor configured to emit red light, and
      a first film arranged on the first phosphor layer, and configured to transmit red light and block light in the range from ultraviolet to blue;
   a green light source including
      a second light emitting element configured to emit light in the range from ultraviolet to blue,
      a second phosphor layer arranged on the second light emitting element, and containing a second phosphor configured to emit green light, and
      a second film arranged on the second phosphor layer, and configured to transmit green light and block light in the range from ultraviolet to blue;
   a blue light source including a third light emitting element configured to emit light in the range from ultraviolet to blue; and
   a light diffusing member arranged above the red light source, the green light source, and the blue light source, the light diffusing member being spaced apart from the red light source, the green light source, and the blue light source with an air layer continuously extending between the light diffusing member and the red light source, the green light source and the blue light source.

2. The light emitting module of claim 1, wherein at least one of the first light emitting element, the second light emitting element, and the third light emitting element is configured to emit blue light.

3. The light emitting module of claim 1, wherein at least one of the first light emitting element, the second light emitting element, and the third light emitting element is configured to emit ultraviolet light.

4. The light emitting module of claim 1, wherein
the first light emitting element, the second light emitting element, and the third light emitting element are configured to emit blue light.

5. The light emitting module of claim 1, wherein
at least one of the first film and the second film is a dielectric multilayer film.

6. The light emitting module of claim 1, wherein
the third light emitting element is configured to emit blue light so that a wavelength of light radiated from the blue light source is the same as a wavelength of the blue light emitted from the third light emitting element.

7. The light emitting module of claim 1, wherein
the third light emitting element is configured to emit ultraviolet light, and
the blue light source further includes a third phosphor layer configured to absorb at least a portion of the ultraviolet light emitted from the third light emitting element and emit blue light.

8. The light emitting module of claim 1, wherein
the red light source further includes a first coating member covering an outside surface of the first light emitting element,
the green light source further includes a second coating member covering an outside surface of the second light emitting element,
the blue light source further includes a third coating member covering an outside surface of the third light emitting element, and
the first coating member, the second coating member and the third coating member are spaced apart from each other.

9. The light emitting module of claim 1, wherein
a wavelength of light emitted from one of the first light emitting element, the second light emitting element and the third light emitting element is different from a wavelength of light emitted from the rest of the first light emitting element, the second light emitting element and the third light emitting element.

* * * * *